US011385666B1

(12) United States Patent
Sadati et al.

(10) Patent No.: US 11,385,666 B1
(45) Date of Patent: Jul. 12, 2022

(54) CIRCUITRY COMPRISING A CAPACITOR

(71) Applicant: Cirrus Logic International Semiconductor Ltd., Edinburgh (GB)

(72) Inventors: Hamed Sadati, Swindon (GB); John A. Breslin, Glasgow (GB); Sushanth Hegde, Edinburgh (GB); John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 17/339,274

(22) Filed: Jun. 4, 2021

(51) Int. Cl.
*G05F 1/56* (2006.01)

(52) U.S. Cl.
CPC ..................... *G05F 1/56* (2013.01)

(58) Field of Classification Search
None
See application file for complete search history.

(56) References Cited

U.S. PATENT DOCUMENTS

| | | | | |
|---|---|---|---|---|
| 6,023,156 A * | 2/2000 | Buhler | ............... | G05F 1/56 323/282 |
| 6,806,692 B2 * | 10/2004 | Lee | ............... | G05F 1/465 323/277 |
| 7,212,067 B2 * | 5/2007 | Pasternak | ............... | G06F 1/305 327/541 |
| 7,382,635 B2 * | 6/2008 | Noda | ............... | H02M 3/07 363/60 |
| 8,026,703 B1 * | 9/2011 | Damaraju | ............... | G05F 1/575 323/275 |
| 8,519,692 B2 * | 8/2013 | Nakashima | ............... | G05F 1/56 323/288 |
| 8,547,075 B1 * | 10/2013 | Mosinskis | ............... | G05F 1/56 323/224 |
| 9,098,101 B2 * | 8/2015 | Naidu | ............... | G05F 1/56 |
| 10,401,942 B2 * | 9/2019 | Bogue | ............... | G06F 1/3287 |
| 10,768,646 B2 * | 9/2020 | Yang | ............... | G05F 1/575 |
| 11,086,343 B2 * | 8/2021 | Kim | ............... | G05F 1/56 |
| 2015/0198959 A1 * | 7/2015 | Kuttner | ............... | H03F 3/45071 323/273 |
| 2017/0083034 A1 * | 3/2017 | Yang | ............... | G05F 1/575 |
| 2020/0064875 A1 * | 2/2020 | Gonapati | ............... | G05F 1/573 |
| 2020/0310505 A1 * | 10/2020 | Suzuki | ............... | G06F 1/28 |
| 2021/0312848 A1 * | 10/2021 | Lee | ............... | G09G 3/20 |

* cited by examiner

*Primary Examiner* — Thomas J. Hiltunen
(74) *Attorney, Agent, or Firm* — Jackson Walker L.L.P.

(57) ABSTRACT

Circuitry comprising: a capacitor; first circuitry; and second circuitry, wherein the circuitry is operable to couple the capacitor to the first circuitry when the first circuitry is active, and to couple the capacitor to the second circuitry when the first circuitry is inactive or is not actively using the capacitor.

12 Claims, 9 Drawing Sheets

US 11,385,666 B1

CIRCUITRY COMPRISING A CAPACITOR

FIELD OF THE INVENTION

The present disclosure relates to circuitry comprising a capacitor.

BACKGROUND

Capacitors are used in electronic circuitry for a variety of purposes. For example, amplifier circuitry may include a compensation capacitor for frequency compensation, to prevent unwanted oscillation. In voltage regulator circuitry, an output capacitor may be provided to reduce output voltage droop at high transient load currents. Capacitors are often used in passive and active filter circuitry, and in analogue to digital converter (ADC) and digital to analogue converter (DAC) circuitry. Many electronic circuits include one or more decoupling capacitors and/or bypass capacitors.

Complex electronic systems may include electronic circuitry for different subsystems that are configured to perform different functions. For example, an electronic audio system may include circuitry for a voltage regulator subsystem which provides a stable supply voltage to other subsystems, circuitry for an amplifier subsystem for amplifying a signal such as an audio signal, circuitry for an ADC and/or DAC subsystem, circuitry for a filter subsystem and the like. Many of these subsystems will include one or more capacitors.

There is a continuing desire to increase the functionality of electronic devices such as mobile telephones and the like, while maintaining or reducing the physical size of the device. Increased device functionality typically involves increasing the amount of electronic circuitry, but the desire to maintain or reduce the physical device size leads to a need for novel ways to minimise the size of the electronic circuitry.

SUMMARY

According to a first aspect, the invention provides circuitry comprising:
 a capacitor;
 first circuitry; and
 second circuitry,
  wherein the circuitry is operable to couple the capacitor to
   the first circuitry when the first circuitry is active, and
   to couple the capacitor to the second circuitry when the
   first circuitry is inactive or is not actively using the
   capacitor.

The circuitry may further comprise switching circuitry operable to couple the capacitor to the first circuitry or the second circuitry.

The circuitry may comprise controller circuitry for coupling the capacitor to the first circuitry when the first circuitry is active, and for coupling the capacitor to the second circuitry when the first circuitry is inactive of is not actively using the capacitor.

The first and second circuitry may comprise first and second portions of the same circuitry.

The first circuitry may comprises a regulating portion of voltage regulator circuitry.

The second circuitry may comprise an output portion of the voltage regulator circuitry.

The circuitry may be configured to couple the capacitor to the first circuitry during operation of the regulator circuitry in a first mode of operation of the voltage regulator circuitry, such that the capacitor acts as a compensating capacitor.

The circuitry may be configured to couple the capacitor to the second circuitry during operation of the regulator circuitry in a second mode of operation of the voltage regulator circuitry, such that the capacitor acts as a reservoir or output voltage smoothing capacitor.

The first mode of operation may be a regulating mode of operation in which the regulating portion of the voltage regulator circuitry is operative to provide a regulated output voltage, and the second mode of operation is a bypass mode of operation in which the regulating portion of the voltage regulator circuitry is bypassed.

The circuitry may further comprise controller circuitry configured to monitor a supply voltage to the voltage regulator circuitry, and to switch the voltage regulator circuitry from the second mode of operation to the first mode of operation when the supply voltage reaches a first threshold, and to switch from the first mode of operation to the second mode of operation when the supply voltage drops to a second threshold.

During operation of the regulator circuitry in the first mode the capacitor may charge up such that the capacitor is pre-charged when the regulator circuitry is switched to operate in the second mode.

At least one of the first and second circuitry may be implemented as an integrated circuit.

The capacitor may be provided outside of the integrated circuit.

At least one of the first and second circuitry may be implemented as an integrated circuit.

The capacitor may be provided on the integrated circuit.

The capacitor may act as a reservoir capacitor, a compensation capacitor, a bypass capacitor, a decoupling capacitor, a feedback capacitor or a Miller capacitor when the capacitor is coupled to the first circuitry.

The capacitor may act as a reservoir capacitor, a compensation capacitor, a bypass capacitor, a decoupling capacitor, a feedback capacitor or a Miller capacitor when the capacitor is coupled to the second circuitry.

The first circuitry may comprise amplifier circuitry, voltage regulator circuitry, or low dropout regulator circuitry.

The second circuitry may comprise amplifier circuitry, voltage regulator circuitry, or low dropout regulator circuitry.

According to a second aspect, the invention provides a system comprising:
 first circuitry;
 second circuitry; and
 a capacitor shared between the first circuitry and the
  second circuitry such that when the first circuitry is
  inactive the capacitor is usable by the second circuitry.

According to a third aspect, the invention provides low dropout regulator (LDO) circuitry comprising:
 a capacitor; and
 controller circuitry,
  wherein the controller circuitry is configured to monitor a
   supply voltage to the LDO circuitry and to switch
   between a first operating mode and a second operating
   mode of the LDO circuitry based on a level of the
   supply voltage, and wherein in the second operating
   mode the capacitor is coupled to an output of the LDO
   regulator circuitry.

According to a fourth aspect, the invention provides an integrated circuit comprising the circuitry of the first, second or third aspect.

According to a fifth aspect, the invention provides a device comprising the circuitry of the first, second or third aspect.

The device may comprise a portable device, a battery powered device, a mobile telephone, a tablet or laptop computer, a smart speaker, an accessory device, a headset device, smart glasses, headphones, earphones or earbuds.

BRIEF DESCRIPTION OF THE DRAWINGS

Embodiments of the invention will now be described, strictly by way of example only, with reference to the accompanying drawings, of which.

DETAILED DESCRIPTION

By sharing a capacitor between different circuitry or between different portions of the same circuitry in an electronic system, the total number of capacitors in the electronic system can be reduced, which can help to minimise or reduce the physical size, weight and bill of materials cost of the electronic system.

Figure 1:
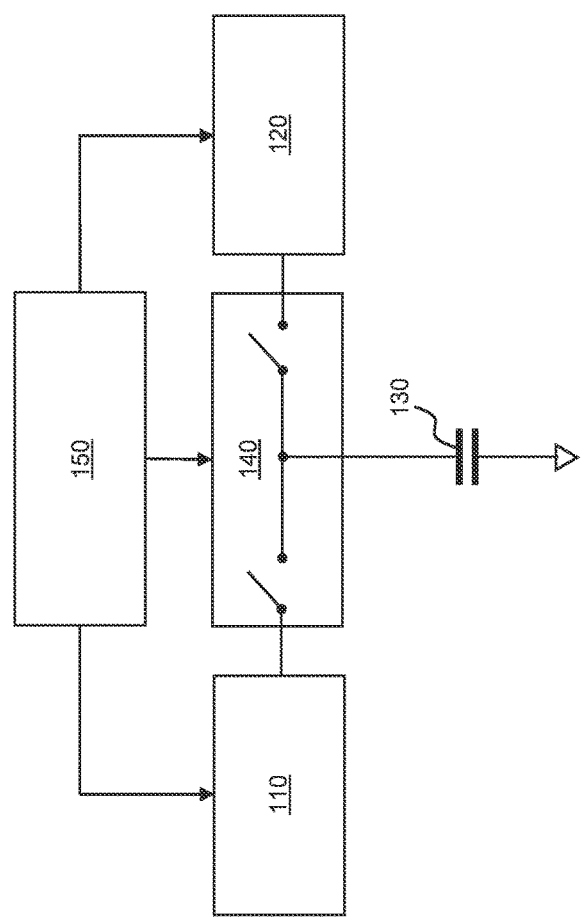
FIG. 1 is a schematic diagram illustrating an electronic system comprising a capacitor.

FIG. 1 is a schematic diagram illustrating an electronic system embodying the general concept of the present disclosure. The electronic system, shown generally at 100 in FIG. 1, includes first circuitry 110, second circuitry 120, a capacitor 130, switching circuitry 140 and control circuitry 150.

At least one of the first circuitry 110 and the second circuitry 120 is operable intermittently. For example, the system 100 may be configured to switch off or power down the first circuitry 110, or to cause the first circuitry 110 to enter an idle mode when no output is required from the first circuitry 110. When the first circuitry 110 is not providing an output, e.g. when the first circuitry 110 is switched off, powered down or in its idle mode, it may be said to be inactive. When the first circuitry 110 is inactive it does not actively use the capacitor 130. The first circuitry 110 may be said to be active when it is providing an output, e.g. when it is switched on or powered up and not in its idle mode.

Similarly, the system 100 may be configured to switch off or power down the second circuitry 120, or to cause the second circuitry 120 to enter an idle mode when no output is required from the second circuitry 120. When the second circuitry 120 is not providing an output, e.g. when the second circuitry 120 is switched off, powered down or in its idle mode, it may be said to be inactive. When the second circuitry 120 is inactive it does not actively use the capacitor 130. The second circuitry 120 may be said to be active when it is providing an output, e.g. when it is switched on or powered up and not in its idle mode.

Additionally, the first and/or second circuitry 110, 120 may be operable in a low power mode or a reduced performance mode in which the capacitor 130 is not actively used by the circuitry.

In some examples, when the first circuitry 110 is active the second circuitry 120 is inactive, and when the second circuitry 120 is active the first circuitry 110 is inactive. In other examples, the first circuitry 110 may be operable intermittently and the second circuitry 120 may be operable substantially continuously, or vice versa.

The switching circuitry 140 is operable to couple the capacitor 130 to either the first circuitry 110 or the second circuitry 120. The control circuitry 150 is operable to control the operation of the first and second circuitry 110, 120 and the switching circuitry 140.

Thus, in some examples, when the first circuitry 110 is deactivated or disabled in response to a control signal output by the control circuitry 150, the control circuitry 150 outputs another control signal to the switching circuitry 140 to couple the capacitor 130 to the second circuitry 120, such that the capacitor 130 can be used by the second circuitry 120. Similarly, when the second circuitry 120 is deactivated or disabled in response to a control signal output by the control circuitry 150, the control circuitry 150 outputs another control signal to the switching circuitry 140 to couple the capacitor 130 to the first circuitry 110, such that the capacitor 130 can be used by the first circuitry 110. In this way a single capacitor 130 can effectively be shared between the first and second circuitry 110, 120.

In other examples in which the first circuitry 110 is operable intermittently and the second circuitry 120 is operable substantially continuously, when the first circuitry 110 is deactivated or disabled in response to a control signal output by the control circuitry 150, the control circuitry 150 outputs control signals to the switching circuitry 140 to decouple the capacitor 130 from the first circuitry 110 and couple the capacitor 130 to the second circuitry 120, such that the capacitor 130 can be used to augment or improve the performance of the second circuitry 120, e.g. by providing additional filtering or smoothing functionality. When the first circuitry 110 is activated or enabled in response to a control signal output by the control circuitry 150, the control circuitry 150 outputs control signals to the switching circuitry 140 to decouple the capacitor 130 from the second circuitry 120 and couple the capacitor 130 to the first circuitry 110, such that the capacitor 130 can be used by the first circuitry 110. In this example the second circuitry 120 continues to operate without the capacitor 130.

The first and second circuitry 110, 120 may be portions of the same circuitry. In one example, the first circuitry 110 may comprise a regulating portion of voltage regulator circuitry which uses the capacitor 130 as a compensating capacitor for frequency compensation in a first, regulating, mode of operation of the voltage regulator circuitry, and the second circuitry 120 may comprise an output portion of the voltage regulator circuitry which, during a transition from the first, regulating, mode to a second, bypass, mode of operation of the voltage regulator circuitry, uses the capacitor 130 as a reservoir capacitor or output voltage smoothing capacitor to reduce droop in an output voltage supplied to a load.

Alternatively, the second circuitry 120 may be separate from the first circuitry 110. In one example, the first circuitry 110 may comprise amplifier circuitry in which the capacitor 130 is used as a compensation capacitor for frequency compensation, and the second circuitry 120 may comprise some other circuitry (e.g. voltage regulator circuitry) in which the capacitor 130 is used for some other purpose, e.g. as a bypass capacitor.

Figure 2:
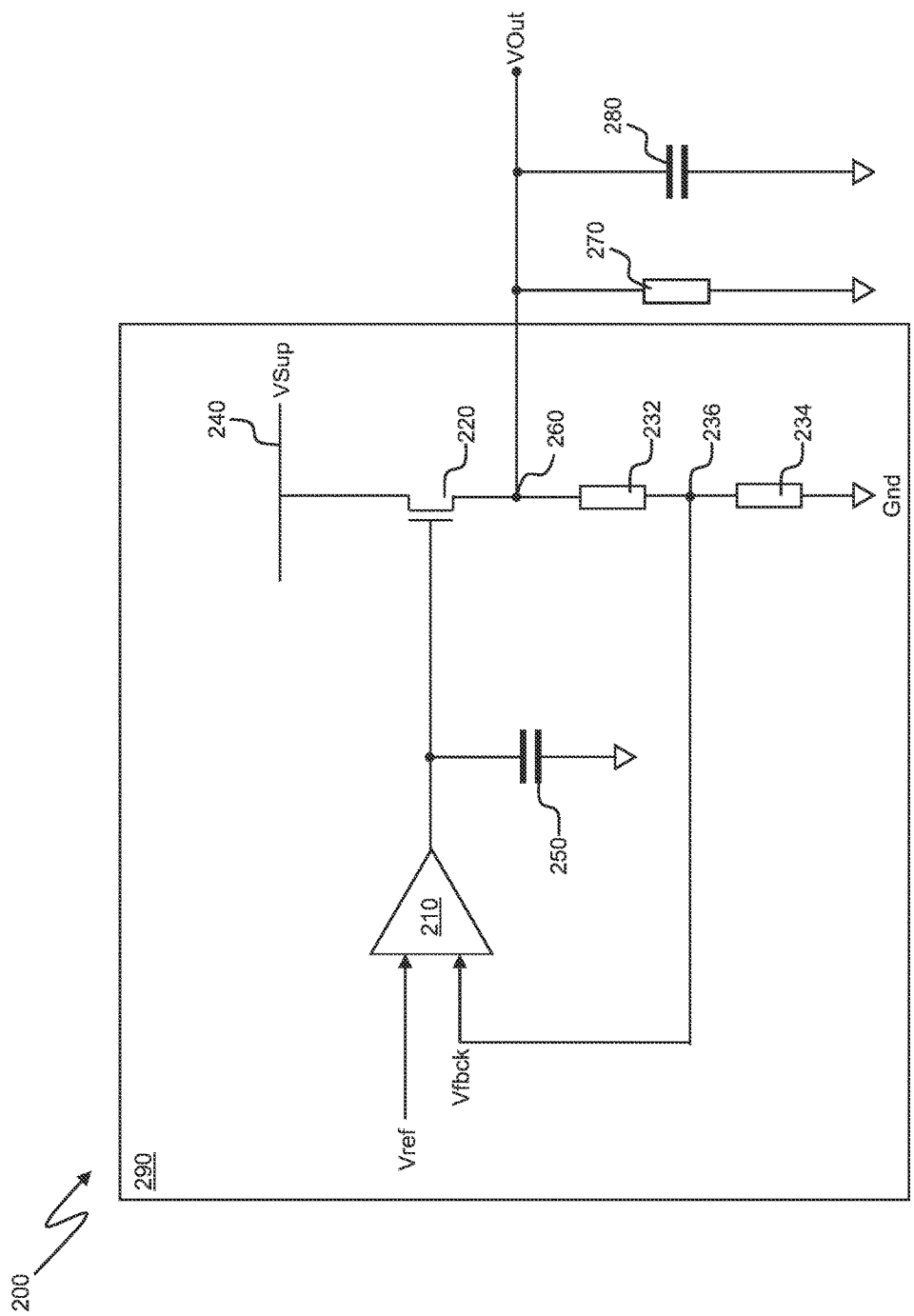
FIG. 2 is a schematic diagram illustrating low dropout (LDO) regulator circuitry.

FIG. 2 is a schematic representation of low dropout (LDO) regulator circuitry. As shown, the LDO regulator circuitry (shown generally at 200) comprises differential amplifier circuitry 210, an output device 220, and a voltage divider comprising first and second series-connected resistances 232, 234.

An output terminal of the differential amplifier circuitry 210 is coupled to a control terminal (e.g. a gate terminal) of the output device 220 (which may be, for example, a MOSFET device), so as to provide a bias voltage to the output device 220. A first terminal (e.g. a drain terminal) of the output device 220 is coupled to a supply voltage rail 240 which provides a supply voltage VSup. The first and second resistances 232, 234 are coupled in series between a second terminal (e.g. a source terminal) of the output device 220 and a reference voltage supply, which in the illustrated example is ground.

A compensating capacitor 250 is coupled between the output terminal of the differential amplifier circuitry 210 and the reference voltage supply.

The differential amplifier circuitry 210, output device 220, voltage divider and compensating capacitor may be considered to comprise a regulating portion of the LDO circuitry 200.

An output node 260 is provided intermediate the second terminal of the output device 220 and the first resistance 232. A load 270 is coupled between the output node 260 and the reference voltage supply, so as to receive a regulated output voltage VOut of the LDO circuitry 200. A reservoir capacitor 280 is also coupled between the output node 260 and the reference voltage supply, to prevent or reduce droop in the output voltage VOut that may arise when the load 270 is coupled to the output node 260. The reservoir capacitor 280 may be considered to comprise an output portion of the LDO circuitry 200.

The differential amplifier circuitry 210, output device 220 and series-connected resistances 232, 234 may be integrated into a single integrated circuit (IC) device 290. The compensation capacitor 250 may also be integrated into the IC device 290, or alternatively (particularly where a large capacitance is required) the compensation capacitor 250 may be provided off-chip, i.e. externally of the integrated circuit device 290. Similarly, the reservoir capacitor 280 (where provided) may be fully or partially integrated into the IC device 290, or may be provided fully or partially off-chip.

In the example shown in FIG. 2, the second input terminal of the amplifier circuitry 210 is coupled to a node 236 intermediate the first and second resistances 232, 234, and thus receives a portion of the regulated voltage supply VOut as a feedback voltage Vfbck.

In an alternative arrangement in which the amplifier circuitry 210 is configured as a voltage buffer (as opposed to the voltage scaler arrangement shown in FIG. 2) the second input terminal of the amplifier circuitry 210 may be coupled directly to the second terminal of the output device 220, such that the second input terminal of the amplifier circuitry 210 receives the regulated voltage supply VOut as the feedback voltage Vfbck. In either case, the feedback arrangement acts to minimise any difference between the reference voltage Vref and the feedback voltage Vfbck, by causing the amplifier circuitry 210 to adjust its output voltage which, as discussed above, is received by the control terminal of the output device 220 as its bias voltage. As will be appreciated by those of ordinary skill in the art, adjusting the bias voltage to the control terminal of the output device 220 changes the voltage across the first and second terminals (e.g. the drain-source voltage) of the output device 220, and therefore changes the regulated voltage supply VOut and hence the feedback voltage Vfbck. Thus, by minimising the difference between Vfbck and Vref, the amplifier circuitry 210 is operative to maintain the regulated supply voltage VOut within the specified voltage range.

Figure 3:
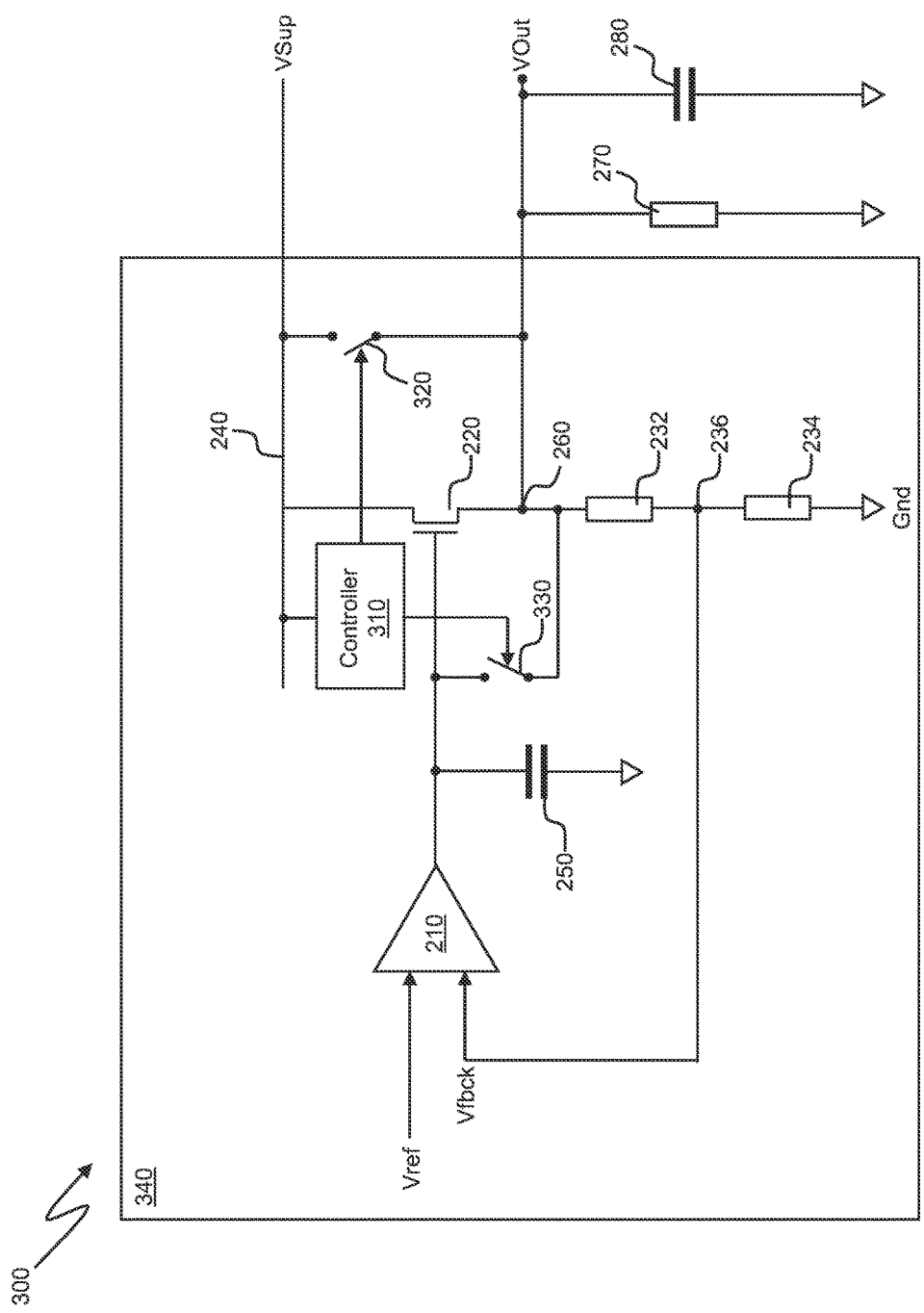
FIG. 3 is a schematic diagram illustrating an electronic system comprising LDO regulator circuitry and bypass circuitry.

FIG. 3 is a schematic representation of an electronic system according to the present disclosure. The electronic system in this example comprises LDO circuitry 300, which is similar in structure and function to the LDO circuitry 200 described above with reference to FIG. 2. Thus FIGS. 2 and 3 include a number of common elements, which are denoted by common reference numerals, and which will not be described again here.

The LDO circuitry 300 differs from the LDO circuitry 200 in that it further includes bypass circuitry comprising controller circuitry 310, a first bypass switch 320 coupled between the output of the differential amplifier circuitry 210 and the output node 260, and a second bypass switch 330 coupled between the supply voltage rail 240 and the output node 260. The controller circuitry 310 is operative to control the operation of the first and second bypass switches 320, 330 so as to switch the LDO circuitry between a first, regulating, mode of operation and a second, bypass, mode of operation. The differential amplifier circuitry 210, output device 220, series-connected resistances 232, 234, controller circuitry 310, first and second bypass switches 320, 330 of the LDO circuitry 300 may be integrated into a single integrated circuit (IC) device 340. The compensation capacitor 250 may also be integrated into the IC device 290, or alternatively (particularly where a large capacitance is required) the compensation capacitor 250 may be provided off-chip, i.e. externally of the integrated circuit device 340. Similarly, the reservoir capacitor 280 (where provided) may be fully or partially integrated into the IC device 340, or may be provided fully or partially off-chip.

In the first, regulating, mode of operation, the first and second bypass switches 320, 330 are opened (in response to suitable control signals from the controller circuitry 310), such that the LDO circuitry 300 provides a regulated output voltage VOut, as described above with reference to FIG. 2.

In the second, bypass, mode of operation, the first bypass switch 320 is closed, in response to a suitable control signal from the controller circuitry 310, such that the supply voltage rail 240 is coupled directly to the load 270. Thus the output voltage VOut follows the supply voltage VSup. The bypass mode is typically used at low supply voltage levels at which the LDO circuitry 300 cannot correctly regulate the output voltage VOut.

In the bypass mode the second bypass switch 330 is also closed, thus coupling the output of the amplifier circuitry 210 directly to the output node 260. Thus in the bypass mode a regulating portion of the LDO circuitry 300 is bypassed, such that the regulating portion of the LDO circuitry does not provide an output, and can thus be regarded as being inactive or inoperative. In the bypass mode the compensation capacitor 250 is not actively used by the regulating portion of the LDO circuitry 300.

Figure 4:
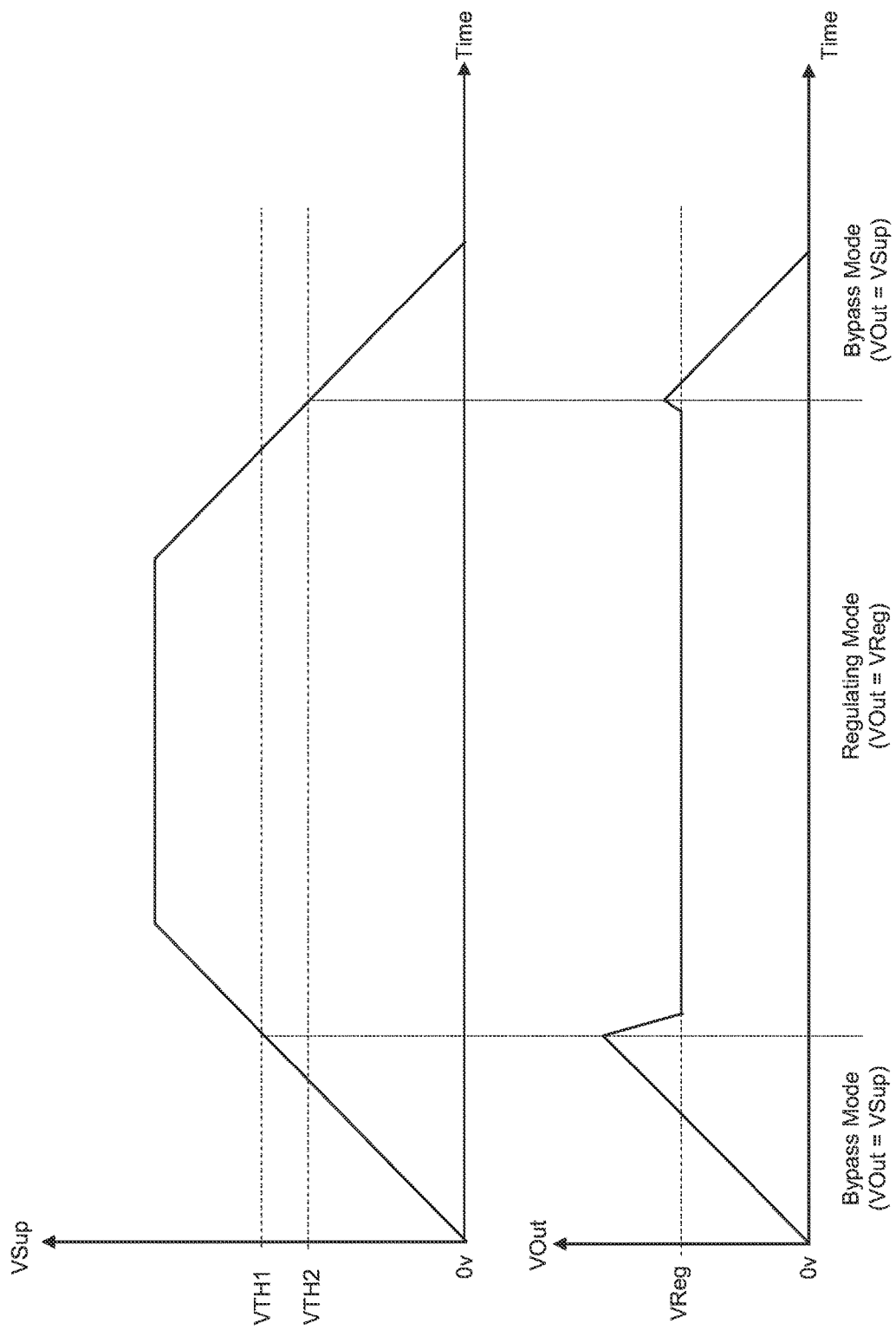
FIG. 4 is a graphical representation of a supply voltage to the LDO circuitry of FIG. 3 and the output voltage VOut of the LDO circuitry of FIG. 3 over time during operation of the electronic system of FIG. 3.

The operation of the LDO circuitry 300 will now be described with reference to FIG. 4, which shows the supply voltage VSup to the LDO circuitry 300 and the output voltage VOut of the LDO circuitry 300 over time.

At start-up of the LDO circuitry 300, the LDO circuitry 300 operates in its bypass mode, with the first and second bypass switches 320, 330 closed. The output voltage VOut thus tracks the supply voltage VSup as VSup increases from 0 v.

The controller circuitry 310 monitors the supply voltage VSup. When the supply voltage VSup reaches a first mode switching threshold VTH1, the controller circuitry 310 outputs a control signal to each of the first and second bypass switches 320, 330 to cause the bypass switches 320, 330 to open. The LDO circuitry 300 thus transitions to its first, regulating, mode of operation.

The first mode switching threshold VTH1 may be higher than a defined regulated output voltage VReg of the LDO circuitry 300. For example, if the LDO circuitry 300 is designed or configured to provide a regulated output voltage VReg of 1.8 v, the first mode switching threshold VTH1 may be 1.92 v.

By switching to the regulating mode when the supply voltage VSup is higher than the defined regulated output voltage VReg of the LDO circuitry 300, droop in the output voltage VOut that could otherwise arise because of the current drawn by the load 270 can be avoided or limited, because at the time at which the transition from bypass mode to regulating mode occurs, the voltage at the control terminal (e.g. a gate terminal) of the output device 220 is at a level that is sufficient to "pre-bias" the output device 220, due to the coupling of the control terminal of the output device 220 to the supply voltage rail 240 by the closed first and second switches 320, 330.

By pre-biasing the output device 220 in this way, the output voltage VOut is higher than the defined regulated output voltage VReg at the time of the transition to the regulating mode. There is thus no delay while the feedback loop of the amplifier circuitry 210 brings the output voltage VOut up to the regulated output voltage (as there would be if the control terminal of the output device 220 were at a voltage lower than VReg at the time of transition). Instead, after the transition the feedback loop causes the output voltage VOut to drop to and settle at the defined regulated output voltage VReg.

Thus, at the time of the transition to the regulating mode there is sufficient voltage headroom in VOut to supply the required load current without droop.

During operation of the LDO circuitry 300 in its regulating mode, the compensating capacitor 250 provides frequency compensation for the LDO circuitry 300.

As the magnitude of the supply voltage VSup falls (e.g. as a result of battery discharge over time and/or with use), the LDO circuitry 300 continues to operate in its regulating mode until the controller circuitry 310 detects that the supply voltage VSup has fallen to a second mode switching threshold VTH2. The second mode switching threshold VTH2 may be lower than the first mode switching threshold VTH1 to provide hysteresis and thus prevent toggling between regulating mode and bypass mode as a result of small fluctuations in the supply voltage VSup. For example, if the defined regulated voltage VReg is 1.8 v, the second mode switching threshold may be 1.85 v.

When the supply voltage VSup falls to the second mode switching threshold VTH2, the controller circuitry 310 outputs a control signal to each of the first and second bypass switches 320, 330 to cause the bypass switches 320, 330 to close. The LDO circuitry 300 thus transitions to its second, bypass, mode of operation, in which the compensation capacitor 250 is not being actively used by the regulating portion of the LDO circuitry 300 and is thus available for use by the output portion.

With the first bypass switch 320 closed, the load 370 is coupled directly to the supply voltage rail 240 to receive the supply voltage VSup. As the second bypass switch 330 is also closed, the compensation capacitor 250 is also directly coupled to the load 270. This coupling of the compensation capacitor 250 can help to prevent or reduce droop in the output voltage VOut that could otherwise occur as a result of the current drawn by the load 270. As the compensation capacitor 250 is charged as a result of the operation of the LDO circuitry 300 in its regulating mode, the compensation capacitor 250 can provide a portion of the required load current, thus reducing or preventing droop in the output voltage.

Thus, in the LDO circuitry 300 the compensation capacitor 250 is used for frequency compensation during operation in the regulating mode, and is used as a reservoir capacitor to smooth the output voltage VOut in the transition between the regulating mode and the bypass mode.

Figure 5:
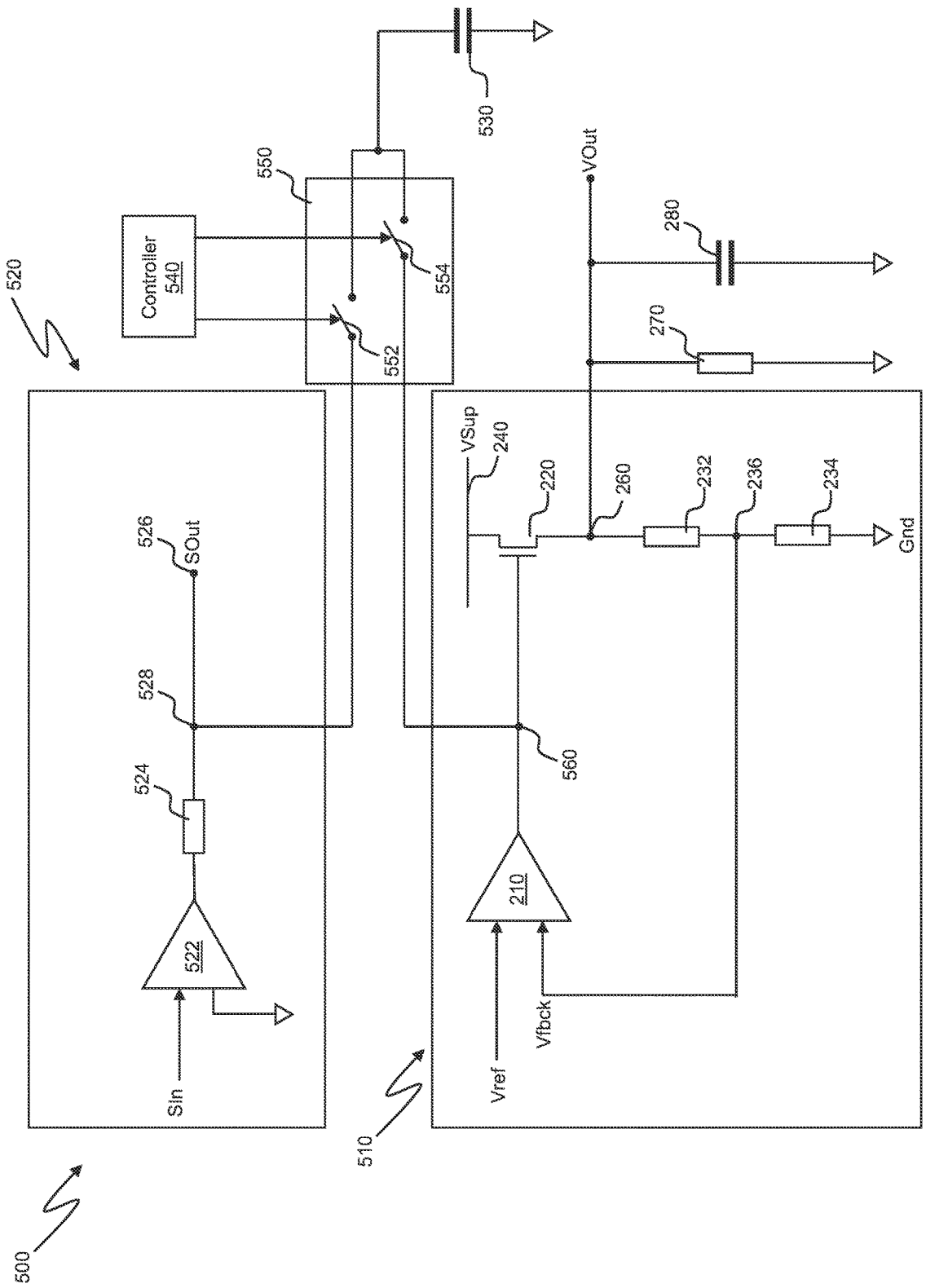
FIG. 5 is a schematic representation illustrating an electronic system comprising LDO regulator circuitry and amplifier circuitry.

FIG. 5 is a schematic representation of an electronic system according to the present disclosure. The electronic system 500 in this example comprises LDO circuitry 510, and amplifier circuitry 520, a capacitor 530, controller circuitry 540 and switching circuitry 550.

The LDO circuitry 510 is similar in structure and function to the LDO circuitry 200 described above with reference to FIG. 2. Thus FIGS. 2 and 5 include a number of common elements, which are denoted by common reference numerals, and which will not be described again here.

The LDO circuitry 510 differs from the LDO circuitry 200 in that it does not include a dedicated compensation capacitor. Instead, the LDO shares the capacitor 530 with the amplifier circuitry 520, and the shared capacitor 530, when coupled to the LDO circuitry 510, provides frequency compensation for the LDO circuitry 510, as will be described in detail below.

The amplifier circuitry 520 in this example comprises operational amplifier circuitry 522 configured to receive an input signal SIn at a first input thereof. A second input of the operational amplifier circuitry is coupled to a reference voltage supply, which in this example is ground.

An output resistor 524 is coupled between an output of the operational amplifier circuitry 522 and an output node 526 of the amplifier circuitry 520. The output resistor 524 provides, with the shared capacitor 530 (when the shared capacitor 530 is coupled to the amplifier circuitry 520), frequency compensation for the amplifier circuitry 520.

The controller circuitry 540 is operable to control first and second switches 552, 554 of the switching circuitry 550 to selectively couple the capacitor 530 to either the LDO circuitry 510 or to the amplifier circuitry 520.

A first terminal of the first switch 552 is coupled to a node 528 between the output resistor 524 and the output node 528 of the amplifier circuitry 520. A second terminal of the first switch 552 is coupled to a first terminal of the capacitor 530. A second terminal of the capacitor 530 is coupled to ground.

Thus, when the first switch 552 is closed the capacitor 530 is coupled between the node 528 and ground, so as to provide (with the output resistor 524) frequency compensation and/or filtering for the amplifier circuitry 520.

A first terminal of the second switch 554 is coupled to a node 560 between the output of the differential amplifier circuitry 210 and the control terminal of the output device 220 of the LDO circuitry 510. A second terminal of the second switch 554 is coupled to the first terminal of the capacitor 530.

Thus, when the second switch 554 is closed the capacitor 530 is coupled between the node 560 and ground, so as to provide frequency compensation for the LDO circuitry 510.

The LDO circuitry 510 and the amplifier circuitry 520 are operable intermittently (e.g. under the control of the controller circuitry 540), such that when the LDO circuitry 510 is operational the amplifier circuitry 520 is not operational, and vice-versa. When the LDO circuitry 510 is inactive or inoperative (e.g. when the LDO circuitry 510 is not required to provide an output voltage), the controller circuitry 540 may output control signals to the switching circuitry 550 to open the second switch 554 and close the first switch 552, such that the capacitor 530 can be used as a compensation capacitor by the amplifier circuitry 520. Similarly, when the amplifier circuitry 520 is inactive or inoperative (e.g. when there is no input signal Sin, or when processing of the input signal has been suspended, such that the amplifier circuitry 510 is not required to provide an output signal SOut), the controller circuitry may output control signals to the switching circuitry 550 to open the first switch 552 and close the second switch 554, such that the capacitor 530 can be used as a compensation capacitor by the LDO circuitry 510.

Thus the capacitor 530 can be shared between the LDO circuitry 510 and the amplifier circuitry 520, thereby reducing the cost and component count of the electronic system 500, in comparison to a system in which the LDO circuitry 510 and the amplifier circuitry 520 each have a dedicated capacitor.

Figure 6:
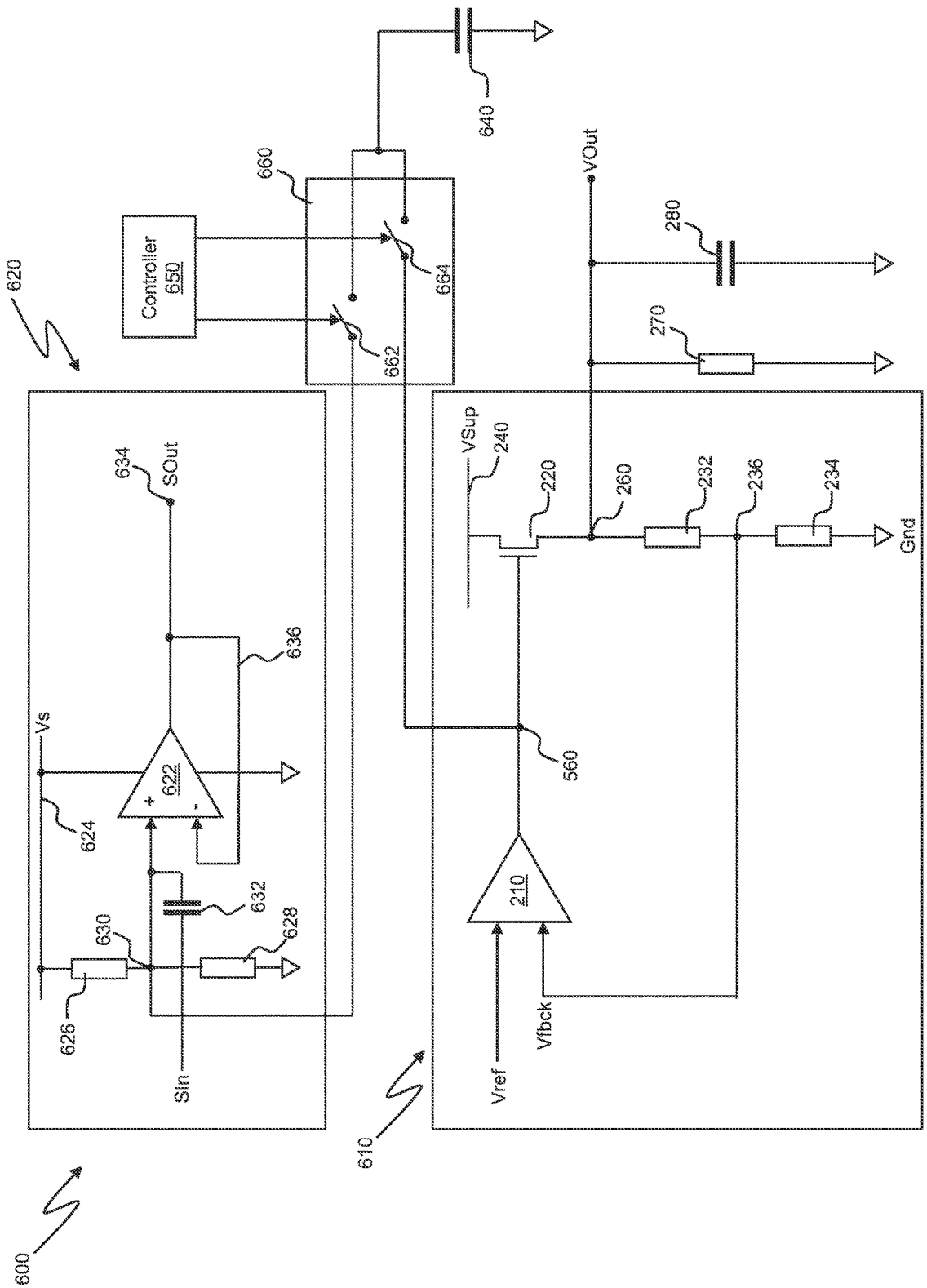
FIG. 6 is a schematic representation illustrating a further electronic system comprising LDO regulator circuitry and amplifier circuitry.

FIG. 6 is a schematic representation of another electronic system according to the present disclosure. The electronic system 600 in this example comprises LDO circuitry 610, amplifier circuitry 620, a capacitor 640, controller circuitry 650 and switching circuitry 660.

The LDO circuitry 610 is similar in structure and function to the LDO circuitry 200 described above with reference to FIG. 2. Thus FIGS. 2 and 6 include a number of common elements, which are denoted by common reference numerals, and which will not be described again here.

The LDO circuitry 610 differs from the LDO circuitry 200 in that it does not include a dedicated compensation capacitor. Instead, the LDO shares the capacitor 640 with the amplifier circuitry 620, and the shared capacitor 640, when coupled to the LDO circuitry 610, provides frequency compensation for the LDO circuitry 610.

The amplifier circuitry 620 in this example comprises single-supply operational amplifier circuitry 622 having a first supply input terminal coupled to a positive power supply rail 624 to receive a positive supply voltage Vs and a second supply input terminal coupled to ground.

A voltage divider comprising first and second resistors 626, 628 coupled in series between the positive power supply rail 624 and ground provides a bias voltage at a node 630 that is coupled to a non-inverting input of the operational amplifier circuitry 622. A coupling capacitor 632 is also coupled to the non-inverting input such that an input signal SIn can be supplied to the non-inverting input.

An output of the operational amplifier circuitry 622 provides an output signal SOut to an output node 634 of the amplifier circuitry 620. The output of the operational amplifier circuitry 622 is also coupled to its inverting input by means of a feedback loop 636. In the illustrated example the feedback loop 634 is shown as a direct connection between the output of the operational amplifier circuitry 622 and the inverting input, for the sake of simplicity and clarity, but it will be appreciated that in a practical implementation of the amplifier circuitry 620 the feedback loop may include one or more resistors, capacitors or other components, depending on the application of the amplifier circuitry 620.

The controller circuitry 650 is operable to control first and second switches 662, 664 of the switching circuitry 660 to selectively couple the capacitor 640 to either the LDO circuitry 610 or to the amplifier circuitry 620.

A first terminal of the first switch 662 is coupled to the node 630 of the amplifier circuitry 620. A second terminal of the first switch 662 is coupled to a first terminal of the capacitor 640. A second terminal of the capacitor 640 is coupled to ground.

Thus, when the first switch 662 is closed, the capacitor 640 is coupled between the node 630 and ground (i.e. in parallel with the second resistor 628), and thus acts as a decoupling capacitor for the amplifier circuitry 620, providing a path to ground for supply voltage ripple.

As in the system 500 of FIG. 6, in the system 600 a first terminal of the second switch 664 is coupled to the node 560 between the output of the differential amplifier circuitry 210 and the control terminal of the output device 220 of the LDO circuitry 510. A second terminal of the second switch 664 is coupled to the first terminal of the capacitor 640.

Thus, when the second switch 664 is closed the capacitor 640 is coupled between the node 560 and ground, so as to provide frequency compensation for the LDO circuitry 610.

The LDO circuitry 610 and the amplifier circuitry 620 are operable intermittently (e.g. under the control of the controller circuitry 650), such that when the LDO circuitry 610 is operational the amplifier circuitry 620 is not operational, and vice-versa. When the LDO circuitry 610 is inactive or inoperative (e.g. when the LDO circuitry 610 is not required to provide an output voltage), the controller circuitry 650 may output control signals to the switching circuitry 660 to open the second switch 664 and close the first switch 662, such that the capacitor 640 can be used as a decoupling capacitor by the amplifier circuitry 620. Similarly, when the amplifier circuitry 620 is inactive or inoperative (e.g. when there is no input signal Sin, or when processing of the input signal has been suspended, such that the amplifier circuitry 620 is not required to provide an output signal SOut), the controller circuitry 650 may output control signals to the switching circuitry 660 to open the first switch 662 and close the second switch 664, such that the capacitor 640 can be used as a compensation capacitor by the LDO circuitry 610.

Thus the capacitor 640 can be shared between the LDO circuitry 610 and the amplifier circuitry 620, thereby reducing the cost and component count of the electronic system 600, in comparison to a system in which the LDO circuitry 610 and the amplifier circuitry 620 each have a dedicated capacitor.

Figure 7:
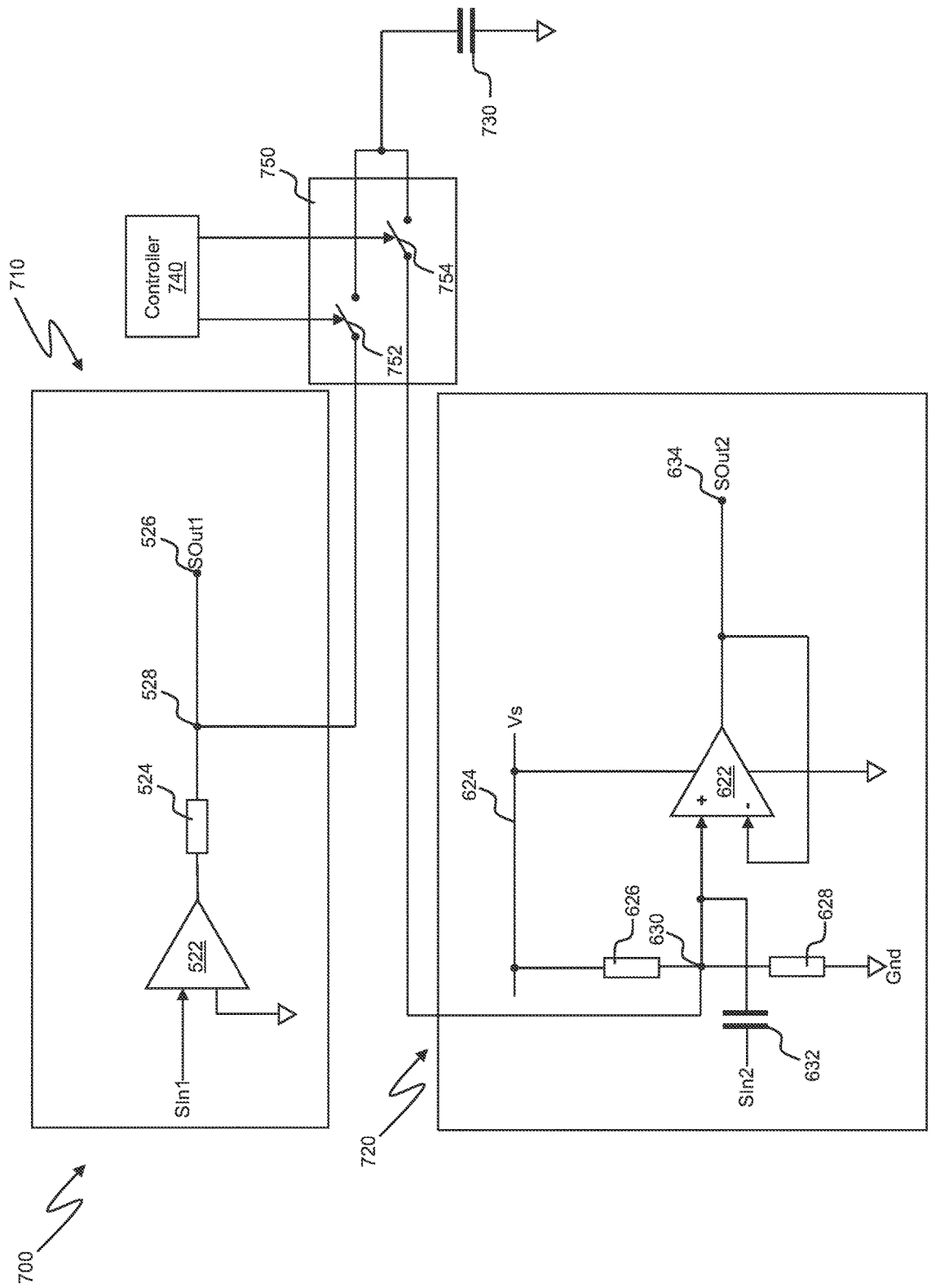
FIG. 7 is a schematic representation illustrating a further electronic system comprising first amplifier circuitry and second amplifier circuitry.

FIG. 7 is a schematic representation of another electronic system according to the present disclosure. The electronic system 700 in this example comprises first amplifier circuitry 710, second amplifier circuitry 720, a shared capacitor 730, controller circuitry 740 and switching circuitry 750.

The first amplifier circuitry 710 is identical in structure and operation to the amplifier circuitry 520 of FIG. 5, and will not be described in detail here. The first amplifier circuitry 710 uses the shared capacitor 730 as a compensation capacitor.

The second amplifier circuitry 720 is identical in structure and operation to the amplifier circuitry 620, and will not be described in detail here. The second amplifier circuitry 720 uses the shared capacitor 730 as a decoupling capacitor.

The controller circuitry 740 is operable to control first and second switches 752, 754 of the switching circuitry 750 to selectively couple the capacitor 730 to either the first amplifier circuitry 710 or to the second amplifier circuitry 720.

A first terminal of the first switch 752 is coupled to the node 528 of the first amplifier circuitry 710. A second terminal of the first switch 752 is coupled to a first terminal of the capacitor 730. A second terminal of the capacitor 730 is coupled to ground.

Thus, when the first switch 752 is closed the capacitor 730 is coupled between the node 528 and ground and thus acts as a compensation capacitor to provide frequency compensation and/or filtering for the first amplifier circuitry 610.

A first terminal of the second switch 754 is coupled to the node 630 of the second amplifier circuitry 720. A second terminal of the second switch 754 is coupled to the first terminal of the capacitor 730.

Thus, when the second switch 754 is closed the capacitor 730 is coupled between the node 630 and ground, and thus acts as a decoupling capacitor for the second amplifier circuitry 720.

The first amplifier circuitry 710 and the second amplifier circuitry 720 are operable intermittently (e.g. under the control of the controller circuitry 740), such that when the first amplifier circuitry 710 is operational the second amplifier circuitry 720 is not operational, and vice-versa. When the second amplifier circuitry 720 is inactive or inoperative (e.g. when there is no input signal Sin2, or when processing of the input signal Sln2 has been suspended, such that the second amplifier circuitry 720 is not required to provide an output signal SOut2), the controller circuitry 740 may output control signals to the switching circuitry 750 to open the second switch 754 and close the first switch 752, such that the capacitor 730 can be used as a compensation capacitor by the first amplifier circuitry 710. Similarly, when the first amplifier circuitry 710 is inactive or inoperative (e.g. when there is no input signal Sin1, or when processing of the input signal Sln1 has been suspended, such that the first amplifier circuitry 710 is not required to provide an output signal SOut1), the controller circuitry 740 may output control signals to the switching circuitry 750 to open the first switch 752 and close the second switch 754, such that the capacitor 730 can be used as a decoupling capacitor by the second amplifier circuitry 720.

Thus the capacitor 730 can be shared between the first amplifier circuitry 710 and the second amplifier circuitry 720, thereby reducing the cost and component count of the electronic system 700, in comparison to a system in which the first amplifier circuitry 710 and the second amplifier circuitry 720 each have a dedicated capacitor.

Figure 8:
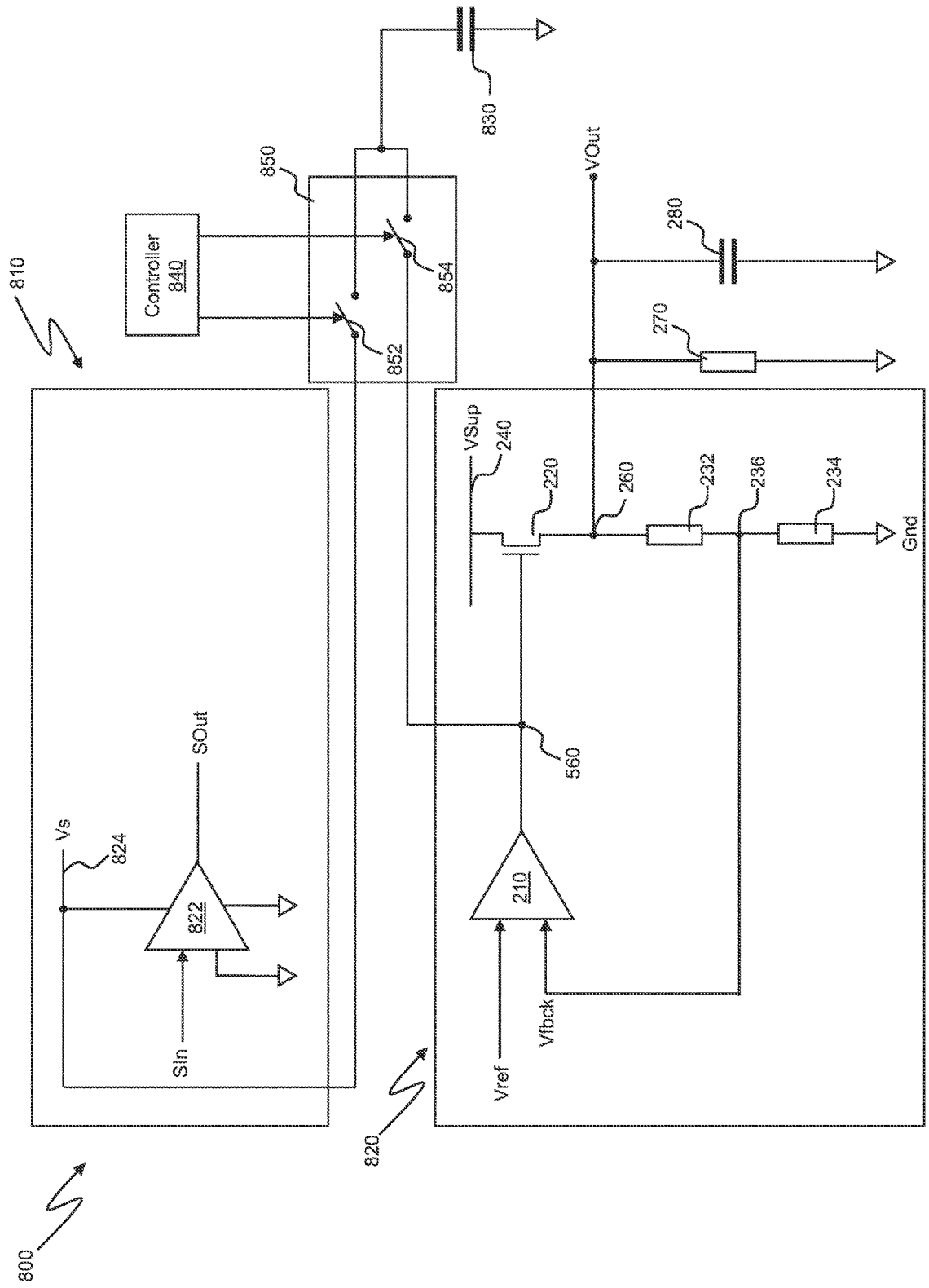
FIG. 8 is a schematic representation illustrating a further electronic system comprising LDO regulator circuitry and amplifier circuitry.

FIG. 8 is a schematic representation of a further example electronic system according to the present disclosure. The electronic system 800 in this example comprises amplifier circuitry 810, LDO circuitry 820, a capacitor 830, controller circuitry 840 and switching circuitry 850.

The amplifier circuitry 810 in this example comprises single-supply operational amplifier circuitry 822 having a first supply input terminal coupled to a positive power supply rail 824 so as to receive a positive supply voltage Vs and second supply input terminal coupled to ground. An input signal Sln is received at an input terminal of the operational amplifier circuitry 822, and an output signal SOut is output at an output terminal of the operational amplifier circuitry 822. As will be appreciated by those of ordinary skill in the art, a practical implementation of the amplifier circuitry 810 may include additional circuitry such as biasing circuitry, feedback circuitry and the like. Such additional circuitry is not shown in FIG. 8, for the sake of clarity and simplicity.

The amplifier circuitry 810 uses the shared capacitor 830 as a decoupling capacitor.

The LDO circuitry 820 is identical in structure and operation to the to the LDO circuitry 510 of FIG. 5, and will not be described in detail here.

The LDO circuitry 820 uses the shared capacitor 830 as a compensation capacitor.

The controller circuitry 840 is operable to control first and second switches 852, 854 of the switching circuitry 850 to selectively couple the capacitor 830 to either the amplifier circuitry 810 or to the LDO circuitry 820.

A first terminal of the first switch 852 is coupled to the positive power supply rail 824 of the amplifier circuitry 810. A second terminal of the first switch 852 is coupled to a first terminal of the capacitor 830. A second terminal of the capacitor 830 is coupled to ground.

Thus, when the first switch 852 is closed the capacitor 830 is coupled between the positive power supply rail 824 and ground and thus acts as a decoupling capacitor for the amplifier circuitry 810.

A first terminal of the second switch 854 is coupled to the node 560 of the LDO circuitry 820. A second terminal of the second switch 854 is coupled to the first terminal of the capacitor 830.

Thus, when the second switch 854 is closed the capacitor 830 is coupled between the node 560 and ground, and thus acts as a compensation capacitor for the second LDO circuitry 820.

The amplifier circuitry 810 and the LDO circuitry 820 are operable intermittently (e.g. under the control of the controller circuitry 840), such that when the amplifier circuitry 810 is operational the LDO circuitry 820 is not operational, and vice-versa. When the LDO circuitry 820 is inactive or inoperative (e.g. when the LDO circuitry 820 is not required to provide an output voltage), the controller circuitry 840 may output control signals to the switching circuitry 850 to open the second switch 854 and close the first switch 852, such that the capacitor 830 can be used as a bypass capacitor by the amplifier circuitry 810. Similarly, when the amplifier circuitry 810 is inactive or inoperative (e.g. when there is no input signal Sin, or when processing of the input signal has been suspended, such that the amplifier circuitry 810 is not required to provide an output signal SOut), the controller circuitry 840 may output control signals to the switching circuitry 850 to open the first switch 852 and close the second switch 854, such that the capacitor 830 can be used as a compensation capacitor by the LDO circuitry 820.

Thus the capacitor 830 can be shared between the amplifier circuitry 810 and the LDO circuitry 820, thereby reducing the cost and component count of the electronic system 800, in comparison to a system in which the amplifier circuitry 810 and the LDO circuitry 820 each have a dedicated capacitor.

In the examples of FIGS. 3-8, one terminal of the shared capacitor is coupled to ground (or some other voltage reference). However, it is to be understood that in other examples the shared capacitor can be coupled between two nodes of a circuit that are not coupled to ground.

Figure 9:
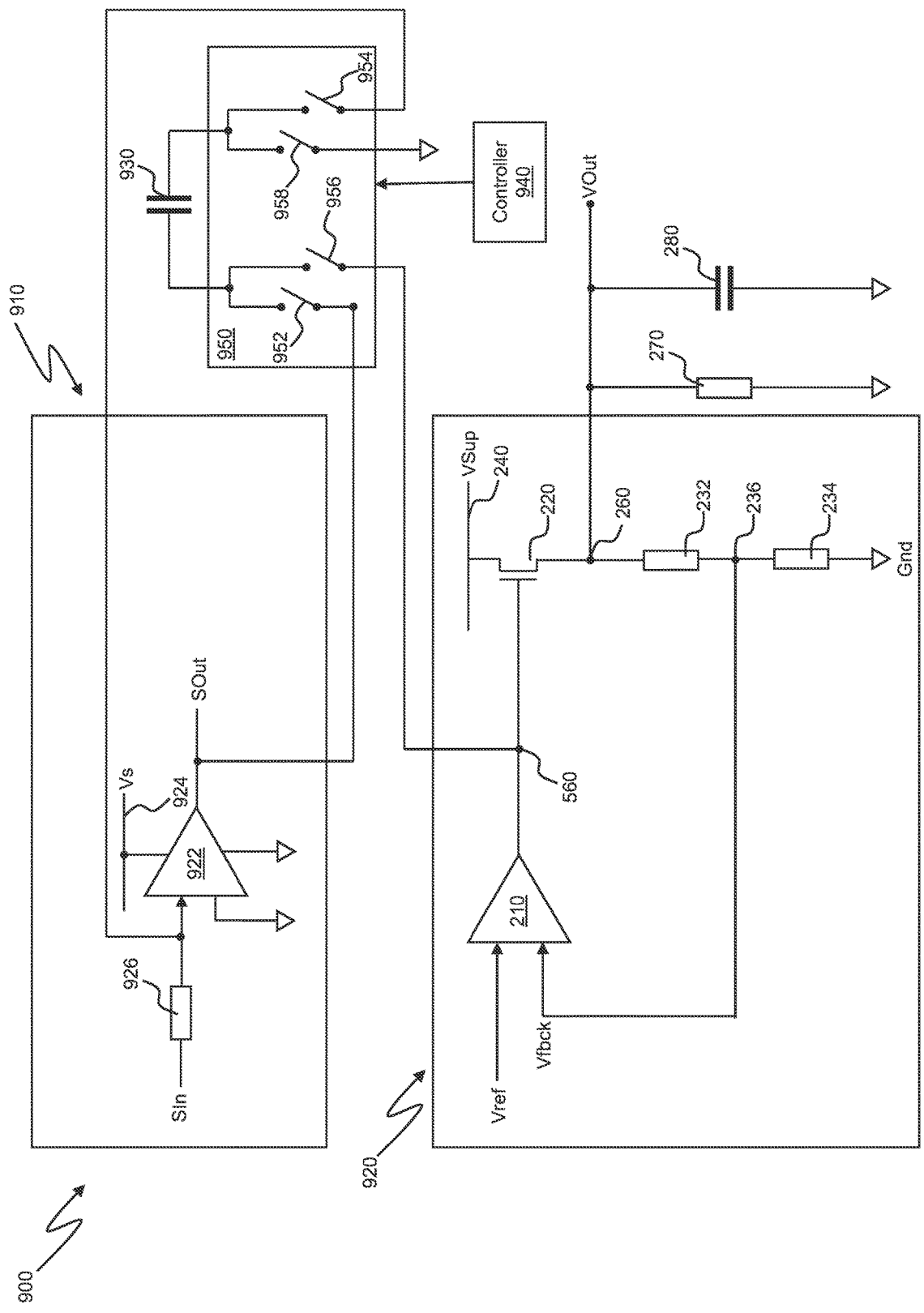
FIG. 9 is a schematic representation illustrating a further electronic system comprising LDO regulator circuitry and amplifier circuitry.

FIG. 9 is a schematic representation of a further example electronic system according to the present disclosure. The electronic system 900 in this example comprises amplifier circuitry 910, LDO circuitry 920, a capacitor 930, controller circuitry 940 and switching circuitry 950.

The amplifier circuitry 910 in this example is configured as an integrator, and comprises single-supply operational amplifier circuitry 922 having a first supply input terminal coupled to a positive power supply rail 924 so as to receive a positive supply voltage Vs and second supply input terminal coupled to ground. An input signal SIn is received at a first input terminal of the operational amplifier circuitry 922 via an input resistor 926, and an output signal SOut is output at an output terminal of the operational amplifier circuitry 922. As will be appreciated by those of ordinary skill in the art, a practical implementation of the amplifier circuitry 910 may include additional circuitry such as biasing circuitry, and the like. Such additional circuitry is not shown in FIG. 9, for the sake of clarity and simplicity.

The amplifier circuitry 910 uses the shared capacitor 930 as a feedback capacitor, coupled between the output terminal and the first input terminal.

The LDO circuitry 920 is identical in structure and operation to the to the LDO circuitry 510 of FIG. 5, and will not be described in detail here.

The LDO circuitry 920 uses the shared capacitor 930 as a compensation capacitor.

The controller circuitry 940 is operable to control first to fourth switches 952-958 of the switching circuitry 950 to selectively couple the capacitor 930 to either the amplifier circuitry 910 or to the LDO circuitry 920.

A first terminal of the first switch 952 is coupled to the output terminal of the operational amplifier circuitry 922 of the amplifier circuitry 910. A second terminal of the first switch 952 is coupled to a first terminal of the capacitor 930.

A second terminal of the capacitor 930 is coupled to a first terminal of the second switch 954. A second terminal of the second switch 954 is coupled to the input terminal of the operational amplifier circuitry 922 of the amplifier circuitry 910.

Thus, when the first and second switches 952, 954 are closed the capacitor 930 is coupled between the output and the first input of the operational amplifier circuitry 922 and thus acts as a feedback capacitor for the amplifier circuitry 910.

A first terminal of the third switch 956 is coupled to the node 560 of the LDO circuitry 920. A second terminal of the third switch 956 is coupled to the first terminal of the capacitor 930.

The second terminal of the capacitor 930 is coupled to a first terminal of the fourth switch 958 (as well as to the first terminal of the second switch 954 as described above). A second terminal of the fourth switch 958 is coupled to ground.

Thus, when the third and fourth switches 956, 958 are closed the capacitor 930 is coupled between the node 560 and ground, and thus acts as a compensation capacitor for the LDO circuitry 920.

The amplifier circuitry 910 and the LDO circuitry 920 are operable intermittently (e.g. under the control of the controller circuitry 940), such that when the amplifier circuitry 910 is operational the LDO circuitry 920 is not operational, and vice-versa. When the LDO circuitry 920 is inactive or inoperative (e.g. when the LDO circuitry 920 is not required to provide an output voltage), the controller circuitry 940 may output control signals to the switching circuitry 950 to open the third and fourth switches 956, 958 and close the first and second switches 952, 954, such that the capacitor 930 can be used as a feedback capacitor by the amplifier circuitry 910. Similarly, when the amplifier circuitry 910 is inactive or inoperative (e.g. when there is no input signal SIn, or when processing of the input signal has been suspended, such that the amplifier circuitry 910 is not required to provide an output signal SOut), the controller circuitry 940 may output control signals to the switching circuitry 950 to open the first and second switches 952, 954 and close the third and fourth switches 956, 958, such that the capacitor 930 can be used as a compensation capacitor by the LDO circuitry 920.

Thus the capacitor 930 can be shared between the amplifier circuitry 910 and the LDO circuitry 920, thereby reducing the cost and component count of the electronic system 900, in comparison to a system in which the amplifier circuitry 910 and the LDO circuitry 920 each have a dedicated capacitor.

The example electronic systems described above use the principle of sharing a capacitor between different circuitry—or between different portions of the same circuitry—to reduce the number of capacitors required in the system, and may thus contribute to a reduction in the cost, size and weight of the system.

Specifically, in the example illustrated in FIG. 3, a capacitor that is used as a compensation capacitor for frequency compensation in a first mode of operation of LDO circuitry may be used as a reservoir capacitor for output voltage smoothing in a second mode of operation of the LDO circuitry.

In the example illustrated in FIG. 5, a capacitor that is used as a compensation capacitor for frequency compensation in LDO circuitry may be used as a compensation capacitor for frequency compensation and/or filtering in amplifier circuitry when the LDO circuitry is inactive or inoperative, and vice versa.

In the example illustrated in FIG. 6, a capacitor that is used as a compensation and/or filtering capacitor for frequency compensation in LDO circuitry may be used as a decoupling capacitor in amplifier circuitry when the LDO circuitry is inactive or inoperative, and vice versa.

In the example illustrated in FIG. 7, a capacitor that is used as a compensation capacitor for frequency compensation in first amplifier circuitry may be used as a decoupling capacitor in second amplifier circuitry when the first amplifier circuitry is inactive or inoperative, and vice versa.

In the example illustrated in FIG. 8, a capacitor that is used as a compensation capacitor for frequency compensation in LDO circuitry may be used as a decoupling capacitor in amplifier circuitry when the LDO circuitry is inactive or inoperative, and vice versa.

In the example illustrated in FIG. 9, a capacitor that is used as a compensation capacitor for frequency compensation in LDO circuitry may be used as a feedback capacitor in amplifier circuitry when the LDO circuitry is inactive or inoperative, and vice versa.

The example electronic systems described above with reference to FIGS. 3-9 are merely examples of possible applications of the present disclosure. As will be readily understood by those of ordinary skill in the art, the principle of sharing a capacitor or one or more fractions or portions of a capacitor between different circuitry—or different portions of the same circuitry—which do not operate simultaneously can be employed in any suitable combination of circuitry or portions of circuitry.

For example, a capacitor that is used as a compensation capacitor or a reservoir capacitor in first LDO circuitry could be used as a compensation capacitor or a reservoir capacitor in second LDO circuitry when the first LDO circuitry is inactive or inoperative, and vice versa.

More generally, a capacitor that is used as a reservoir capacitor, a smoothing capacitor, a compensation capacitor, a bypass capacitor, a decoupling capacitor, a feedback capacitor or a Miller capacitor or the like during operation of first circuitry, or of a first portion of circuitry, of an electronic system may be used as a reservoir capacitor, a smoothing capacitor, a compensation capacitor, a bypass capacitor, a decoupling capacitor, a feedback capacitor or a Miller capacitor or the like in operation of second circuitry, or of a second portion of the circuitry of the electronic system.

In the examples described above with reference to FIGS. 5-9, when first circuitry (e.g. LDO circuitry 510, 610 or amplifier circuitry 710, 810, 910) is active or operative, second circuitry (e.g. amplifier circuitry 520, 620, 720 or LDO circuitry 820, 920) is inactive or inoperative. However, in other examples one of the first and second circuitry may be operable intermittently and the other of the first and second circuitry may be operable substantially continuously. In such examples a capacitor may be coupled to, for example, the first circuitry when the first circuitry is active or operative, e.g. to act as a reservoir capacitor, a smoothing capacitor, a compensation capacitor, a bypass capacitor, a decoupling capacitor, a feedback capacitor or a Miller capacitor or the like, and may be decoupled from the first circuitry and coupled to the second circuitry when the first circuitry is inactive or inoperative, to augment or improve the functionality of the second circuitry, e.g. by providing additional filtering or smoothing capabilities.

In other examples, instead of being deactivated by being switched off, powered down or placed in an idle mode, one of the first and second circuitry may be capable of operating in a low power mode, a reduced performance mode or the like, in which the capacitor is not actively used by the circuitry. In such examples, the capacitor may be coupled to, for example, the first circuitry when the first circuitry is active or operative, e.g. to act as a reservoir capacitor, a smoothing capacitor, a compensation capacitor, a bypass capacitor, a decoupling capacitor, a feedback capacitor or a Miller capacitor or the like, and may be decoupled from the first circuitry and coupled to the second circuitry when the first circuitry is not actively being used by the first circuitry, e.g. to act as a reservoir capacitor, a smoothing capacitor, a compensation capacitor, a bypass capacitor, a decoupling capacitor, a feedback capacitor or a Miller capacitor or the like, or to augment or improve the functionality of the second circuitry, e.g. by providing additional filtering or smoothing capabilities.

The present disclosure further extends to sharing or re-use of a capacitor or one or more fractions or portions thereof between more than two different portions of circuitry, or more than two different circuits, in an electronic system.

Thus, a capacitor that is used as a reservoir capacitor, a compensation capacitor, a bypass capacitor, a decoupling capacitor, a feedback capacitor or a Miller capacitor or the like during operation of a first circuit of a plurality of different circuits, or of a first portion of a plurality of portions of circuitry, of an electronic system may be used as a reservoir capacitor, a compensation capacitor, a bypass capacitor, a decoupling capacitor, a feedback capacitor, a Miller capacitor or the like in operation of a second, third, . . . , nth circuit of the plurality of different circuits, or of a second, third, . . . , nth portion of the plurality of portions of the circuitry of the electronic system.

This sharing or re-purposing of a capacitor or one or more fractions or portions thereof between multiple different circuits or portions of circuitry in an electronic system can contribute to a reduction in the cost, size, and weight of the electronic system.

Embodiments may be implemented as an integrated circuit which in some examples could be a codec or audio DSP or similar. Embodiments may be incorporated in an electronic device, which may for example be a portable device and/or a device operable with battery power. The device could be a communication device such as a mobile telephone or smartphone or similar. The device could be a computing device such as a notebook, laptop or tablet computing device. The device could be a wearable device such as a smartwatch. The device could be a device with voice control or activation functionality such as a smart speaker. In some instances the device could be an accessory device such as a headset, headphones, earphones, earbuds or the like to be used with some other product.

The skilled person will recognise that some aspects of the above-described apparatus and methods, for example the discovery and configuration methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re)programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. Circuitry comprising:
   a capacitor;
   first circuitry; and
   second circuitry,
   wherein the circuitry is operable to couple the capacitor to the first circuitry when the first circuitry is active, and to couple the capacitor to the second circuitry when the first circuitry is inactive or is not actively using the capacitor, wherein:
   the first circuitry comprises a regulating portion of voltage regulator circuitry;
   the second circuitry comprises an output portion of the voltage regulator circuitry;
   the circuitry is configured to couple the capacitor to the first circuitry during operation of the regulator circuitry in a first mode of operation of the voltage regulator circuitry, such that the capacitor acts as a compensating capacitor; and
   the circuitry is configured to couple the capacitor to the second circuitry during operation of the regulator circuitry in a second mode of operation of the voltage regulator circuitry, such that the capacitor acts as a reservoir or output voltage smoothing capacitor,
   wherein the first mode of operation is a regulating mode of operation in which the regulating portion of the voltage regulator circuitry is operative to provide a regulated output voltage, and the second mode of operation is a bypass mode of operation in which the regulating portion of the voltage regulator circuitry is bypassed,
   and wherein the circuitry further comprises controller circuitry configured to monitor a supply voltage to the voltage regulator circuitry and to switch the voltage regulator circuitry from the second mode of operation to the first mode of operation when the supply voltage reaches a first threshold, and to switch from the first mode of operation to the second mode of operation when the supply voltage drops to a second threshold.

2. Circuitry according to claim 1 further comprising switching circuitry operable to couple the capacitor to the first circuitry or the second circuitry.

3. Circuitry according to claim 1, wherein the circuitry comprises controller circuitry for coupling the capacitor to the first circuitry when the first circuitry is active, and for coupling the capacitor to the second circuitry when the first circuitry is inactive or is not actively using the capacitor.

4. Circuitry according to claim 1, wherein during operation of the regulator circuitry in the first mode the capacitor charges up such that the capacitor is pre-charged when the regulator circuitry is switched to operate in the second mode.

5. Circuitry according to claim 1, wherein at least one of the first and second circuitry is implemented as an integrated circuit, and wherein the capacitor is provided outside of the integrated circuit.

6. Circuitry according to claim 1, wherein at least one of the first and second circuitry is implemented as an integrated circuit, and wherein the capacitor is provided on the integrated circuit.

7. Circuitry according to claim 4, wherein the capacitor acts as a reservoir capacitor, a compensation capacitor, a bypass capacitor, a decoupling capacitor, a feedback capacitor or a Miller capacitor when the capacitor is coupled to the first circuitry, and wherein the capacitor acts as a reservoir capacitor, a compensation capacitor, a bypass capacitor, a decoupling capacitor, a feedback capacitor or a Miller capacitor when the capacitor is coupled to the second circuitry.

8. An integrated circuit comprising the circuitry of claim 1.

9. A device comprising the circuitry of claim 1.

10. A device according to claim 9, wherein the device comprises a portable device, a battery powered device, a mobile telephone, a tablet or laptop computer, a smart speaker, an accessory device, a headset device, smart glasses, headphones, earphones or earbuds.

11. A system comprising:
    first circuitry;
    second circuitry; and
    a capacitor shared between the first circuitry and the second circuitry such that when the first circuitry is inactive the capacitor is usable by the second circuitry, wherein:
    the first circuitry comprises a regulating portion of voltage regulator circuitry;

the second circuitry comprises an output portion of the voltage regulator circuitry;

the circuitry is configured to couple the capacitor to the first circuitry during operation of the regulator circuitry in a first mode of operation of the voltage regulator circuitry, such that the capacitor acts as a compensating capacitor; and the circuitry is configured to couple the capacitor to the second circuitry during operation of the regulator circuitry in a second mode of operation of the voltage regulator circuitry, such that the capacitor acts as a reservoir or output voltage smoothing capacitor, wherein the first mode of operation is a regulating mode of operation in which the regulating portion of the voltage regulator circuitry is operative to provide a regulated output voltage, and the second mode of operation is a bypass mode of operation in which the regulating portion of the voltage regulator circuitry is bypassed, and wherein the circuitry further comprises controller circuitry configured to monitor a supply voltage to the voltage regulator circuitry and to switch the voltage regulator circuitry from the second mode of operation to the first mode of operation when the supply voltage reaches a first threshold, and to switch from the first mode of operation to the second mode of operation when the supply voltage drops to a second threshold.

12. Low dropout regulator (LDO) circuitry comprising:

a capacitor; and controller circuitry, wherein the controller circuitry is configured to monitor a supply voltage to the LDO circuitry and to switch between a first operating mode and a second operating mode of the LDO circuitry based on a level of the supply voltage, wherein in the first operating mode the capacitor is coupled to a regulating portion of the LDO circuitry such that the capacitor acts as a compensation capacitor and in the second operating mode the capacitor is coupled to an output of the LDO regulator circuitry such that the capacitor acts as a reservoir or output voltage smoothing capacitor, and wherein:

the first operating mode is a regulating mode of operation in which the regulating portion of the voltage regulator circuitry is operative to provide a regulated output voltage, and the second operating mode is a bypass mode of operation in which the regulating portion of the voltage regulator circuitry is bypassed, and the controller circuitry is configured to switch the LDO circuitry from the second operating mode to the first operating mode when the supply voltage reaches a first threshold, and to switch from the first operating mode to the second operating mode when the supply voltage drops to a second threshold.

\* \* \* \* \*

UNITED STATES PATENT AND TRADEMARK OFFICE
CERTIFICATE OF CORRECTION

| | | |
|---|---|---|
| PATENT NO. | : 11,385,666 B1 | |
| APPLICATION NO. | : 17/339274 | |
| DATED | : July 12, 2022 | |
| INVENTOR(S) | : Sadati et al. | |

It is certified that error appears in the above-identified patent and that said Letters Patent is hereby corrected as shown below:

In the Specification

1. In Column 1, Line 58, delete "inactive of" and insert -- inactive or --, therefor.

2. In Column 1, Line 62, delete "comprises" and insert -- comprise --, therefor.

3. In Column 5, Line 38, delete "intermediate" and insert -- intermediate to --, therefor.

4. In Column 8, Line 32, delete "and amplifier" and insert -- amplifier --, therefor.

5. In Column 9, Lines 25-26, delete "amplifier circuitry 510" and insert -- amplifier circuitry 520 --, therefor.

6. In Column 10, Line 3, delete "feedback loop 634" and insert -- feedback loop 636 --, therefor.

7. In Column 11, Line 17, delete "first amplifier circuitry 610." and insert -- first amplifier circuitry 710. --, therefor.

8. In Column 12, Line 10, delete "to the to the" and insert -- to the --, therefor.

9. In Column 13, Line 21, delete "to the to the" and insert -- to the --, therefor.

In the Claims

10. In Column 18, Line 42, in Claim 7, delete "claim 4," and insert -- claim 1, --, therefor.

Signed and Sealed this
Twenty-third Day of May, 2023

Katherine Kelly Vidal
*Director of the United States Patent and Trademark Office*